United States Patent [19]
Huggins et al.

[11] Patent Number: 5,949,323
[45] Date of Patent: Sep. 7, 1999

[54] NON-UNIFORM WIDTH CONFIGURABLE FUSE STRUCTURE

[75] Inventors: Alan H. Huggins, Gilroy; Ron Thomas, Salinas; David E. Schmulian, San Jose, all of Calif.

[73] Assignee: Clear Logic, Inc., San Jose, Calif.

[21] Appl. No.: 09/107,841

[22] Filed: Jun. 30, 1998

[51] Int. Cl.⁶ ............................ H01H 37/36; H01L 27/10; H01L 27/115

[52] U.S. Cl. ........................... 337/401; 337/416; 337/159; 257/209; 257/529

[58] Field of Search ................................. 337/5, 297, 296, 337/290, 159, 160, 161, 298, 401, 404, 405, 416, 417; 174/261; 257/209, 529, 530

[56] References Cited

U.S. PATENT DOCUMENTS

| | | | |
|---|---|---|---|
| 4,417,224 | 11/1983 | Ross | 337/164 |
| 4,814,853 | 3/1989 | Uchida | 357/51 |
| 4,910,418 | 3/1990 | Graham et al. | 307/465 |
| 4,973,932 | 11/1990 | Krueger et al. | 337/164 |
| 5,084,691 | 1/1992 | Lester et al. | 337/297 |
| 5,120,152 | 6/1992 | Gueli | 403/179 |
| 5,373,379 | 12/1994 | Nakai | 359/59 |
| 5,451,811 | 9/1995 | Whitten et al. | 257/530 |
| 5,523,253 | 6/1996 | Gilmour et al. | 437/60 |

Primary Examiner—Leo P. Picard
Assistant Examiner—Anatoly Vortman
Attorney, Agent, or Firm—Skjerven, Morrill, MacPherson, Franklin & Friel LLP; Tom Chen

[57] ABSTRACT

A radiant-energy configurable fuse structure and array are provided in which the fuse body of the fuse is wider than the fuse connection terminals. The fuse body can be circular or polygonal to capture more of the radiant energy from a targeting beam, which reduces the energy required to blow the fuse. As a result, unrelated circuit elements and patterned lines can be placed closer together in a laser fuse array, thereby increasing the packing density of such arrays.

22 Claims, 3 Drawing Sheets

NON-UNIFORM WIDTH CONFIGURABLE FUSE STRUCTURE

BACKGROUND

1. Field of the Invention

The present invention relates generally to radiant-energy fuse structures which are configured to customize electronic devices, and more particularly, to a radiant-energy configurable fuse structure having a non-uniform width.

2. Description of Related Art

Configurable fuses are widely used in the electronics industry for the configuration or repair of elements in memory and logic circuits. These fuses are made from conductive materials such as polysilicon, silicides, and metals. The fuses are typically formed on and covered by one or more insulating layers such as silicon oxide or silicon nitride, thus encapsulating the fuse. During configuration, selected fuses are typically irradiated from above by a radiant energy beam, which is generally circular or elliptical in shape and provides a measurable radiant energy. The most common means of providing this energy is through a laser beam, such as the Model 1225hp manufactured by Electro-Scientific Incorporated (ESI) of Portland, Oreg. The radiant energy heats the material in the fuse until a portion of it becomes a liquid, a vapor, or a combination thereof (hereinafter referred to as a liquid/vapor state). Simultaneously, heat propagates along the length of the fuse from the irradiated to the non-irradiated sections. The change in the fuse material state from a solid to a liquid/vapor state causes pressure to build up in the cavity that contains the fuse. This results in a rupturing of the insulator, typically along the structurally-weakest point. At least a portion of the fuse material escapes through this ruptured area. The thickness of the insulator over the fuse is usually chosen to be thinner than the film surrounding the fuse so that the insulator portion over the fuse will be the first area to undergo structural failure when the pressure reaches a critical value. In this manner, the insulator over the fuse will be blown off and the force of the explosion directed away from neighboring critical circuit elements. It is common for the thickness of the insulator to be set to a value that provides the most consistent results in disconnection of the fuse (hereafter generally referred to as fuse blowing).

FIG. 1 illustrates a top plan view of a conventional electronic device having conventional configurable fuses 1. Each of fuses 1 has a fuse body 2, which is typically the same width or narrower than connection terminals 3 connecting conductive lines 4 and 5 to underlying elements. A radiant energy beam 7 severs the connection between line 4 and line 5 by directing the beam at fuse body 2. Because the thermal conductivity of the fuse material greatly exceeds that of a typical insulator which encloses the fuse, the majority of the transmitted heat from the radiant energy beam 7 is conducted through the connection terminals 3, and not the insulator. Thus, the connection terminals 3 must be long enough to protect lines 4 and 5 from damage as a result of thermal conduction, which adds to the spacing between lines 4 and 5. While the additional length protects the lines, a significant amount of transmitted heat is also drawn away from the fuse body. The overall energy required to blow the fuse must therefore be increased to compensate for this loss. However, since beam 7 typically has a radial energy distribution which is approximately Gaussian in nature, increasing the beam energy necessarily increases the effective spot size 6 of beam 7 (effective spot size being defined as the diameter of the area of radiant energy beam which could affect active circuit elements). Thus, as the energy increases, adjacent ones of fuses 1 must be spaced further apart. Consequently, the packing density of the conventional fuses 1 is relatively low, requiring significant layout area when compared with simple non-configurable interconnect lines. The result is an undesirable lower density and larger size device.

With a conventional fuse design as shown in FIG. 1, some of the energy is captured along the length of the fuse body 2, while much of the remainder is lost outside the much narrower fuse body width. The energy not captured by the fuse body 2 is then free to travel past the fuse to any underlying circuit elements which might be routed below it. Therefore, it has been common for the area around and under the fuses to be clear of circuit elements (e.g., transistors, resistors, signal lines, junctions, etc.) so that the radiant energy used to configure the fuses does not damage these circuit elements. The addition of this clear area increases the overall size of the device, as does the additional area required to place or route circuit elements away from the fuse area.

The conventional fuse design is also subject to inconsistency in fuse blowing. Variations in the thickness of the fuse material and the insulator over the fuse can result in the fuse blowing earlier or later in the fuse blowing process and producing irregularly sized and shaped holes from which the fuse material escapes. Thus, the fuse material may not be sufficiently vaporized to complete the disconnection, or the surrounding insulator may rupture, thereby damaging neighboring circuit elements.

The above manufacturing constraints seriously complicate how an electronic device can be laid out and effectively increases the area for the circuit elements of the device.

Accordingly, it is desirable to provide a radiant-energy configurable fuse that overcomes the deficiencies discussed above with respect to conventional fuses.

SUMMARY

The present invention provides a radiant-energy configurable fuse having a fuse body wider than at least one of the fuse connection terminals.

More specifically, in one embodiment of the invention, a fuse comprises a fuse body extending outwardly to two fuse terminals. The fuse body is defined as the area generally irradiated by the radiant energy beam, while the terminals are defined as the areas which connect the fuse body to surrounding circuitry. The fuse body has a larger width than at least one of the two fuse terminals.

In accordance with another aspect of this invention, a method is provided which allows an electronic device to be formed with circuit elements underlying radiant-energy configurable fuses. The method includes providing a substrate having circuit elements, forming an insulation layer above the circuit elements, and forming at least one configurable fuse having a fuse body and two fuse terminals, whereby the width of the fuse body is greater than the width of at least one of the two connection terminals.

The fuse body structure of the present invention allows a greater capture of the energy delivered by the radiant-energy beam over the conventional fuse design, thereby permitting the overall delivered energy to be reduced. This will in turn reduce the effective spot size. Since the effective spot size is smaller, the fuses can be placed closer together without risking damage to a neighboring fuse. The lower energy will in some cases also permit the presence of circuit elements below the fuse locations. Either benefit will result in a desirable reduction in the size of the electronic device. The geometry of the fuse body structure also allows a more consistent decapping of the insulator over the fuse during the configuration process, which results in more complete vaporization of the fuse material, leading to a more reliable configuration of the fuse. The lower energy minimizes the risk of rupturing the insulator towards a neighboring circuit element, also leading to a more reliable configuration of the fuse.

The connection terminals of the present invention are preferably the minimum allowed line width for the patterned interconnect layer in which the fuse resides. This narrow width provides the maximum resistance to undesired heat conduction from the fuse body through the connection terminals to adjacent circuit elements. This feature results in a more restrictive path for the heat to conduct away from the fuse body, thereby reducing the need to have relatively long connection terminals to provide thermal isolation. Thus, the terminal length can be shortened, resulting in a shorter overall fuse length and increasing packing density. The reduction in heat loss also results in more energy being retained by the fuse body for the fuse disconnection process.

The present invention will be better understood in light of the following detailed description taken together with the accompanying drawings.

BRIEF DESCRIPTION OF THE DRAWINGS

Use of the same reference numbers in different figures indicates similar or like elements.

DETAILED DESCRIPTION

There are several factors which are considered when evaluating an effective fuse design. The area of the fuse body will determine how much of the applied laser energy is captured by the fuse and used in the fuse blowing process, and also how much energy misses the fuse and is available to disrupt underlying or neighboring circuit elements. A larger fuse area will result in a greater capture of this energy. Moreover, for any given thickness of the oxide or dielectric over the fuse, a larger fuse area will reduce the amount of energy required to break the oxide and complete this disconnection. Thus, increasing the fuse width in a conventional fuse design results in more desirable results for these factors. However, a wider fuse results in a larger transmission path for the thermal energy to escape and damage neighboring circuitry, and also results in less of the applied energy being available for the fuse blowing process. This can be compensated for by increasing the length of the fuse terminals so that the heat conduction does not reach neighboring circuitry, but this results in an undesirable reduction in the packing density of the fuses, and a larger overall circuit design. Narrowing the fuse width in a conventional design reduces the undesired thermal transmission, but has the negative effect of reducing the area of the fuse, thus lowering the amount of energy captured, increasing the energy required to break the overlying oxide, and increasing the amount of energy that misses the fuse and can damage underlying circuitry. Thus, one variable in the design cannot be changed without having a negative effect on the other. The design of the present invention allows the variable of fuse area, shape, and terminal width to be independently adjusted to optimum values.

Figure 1:
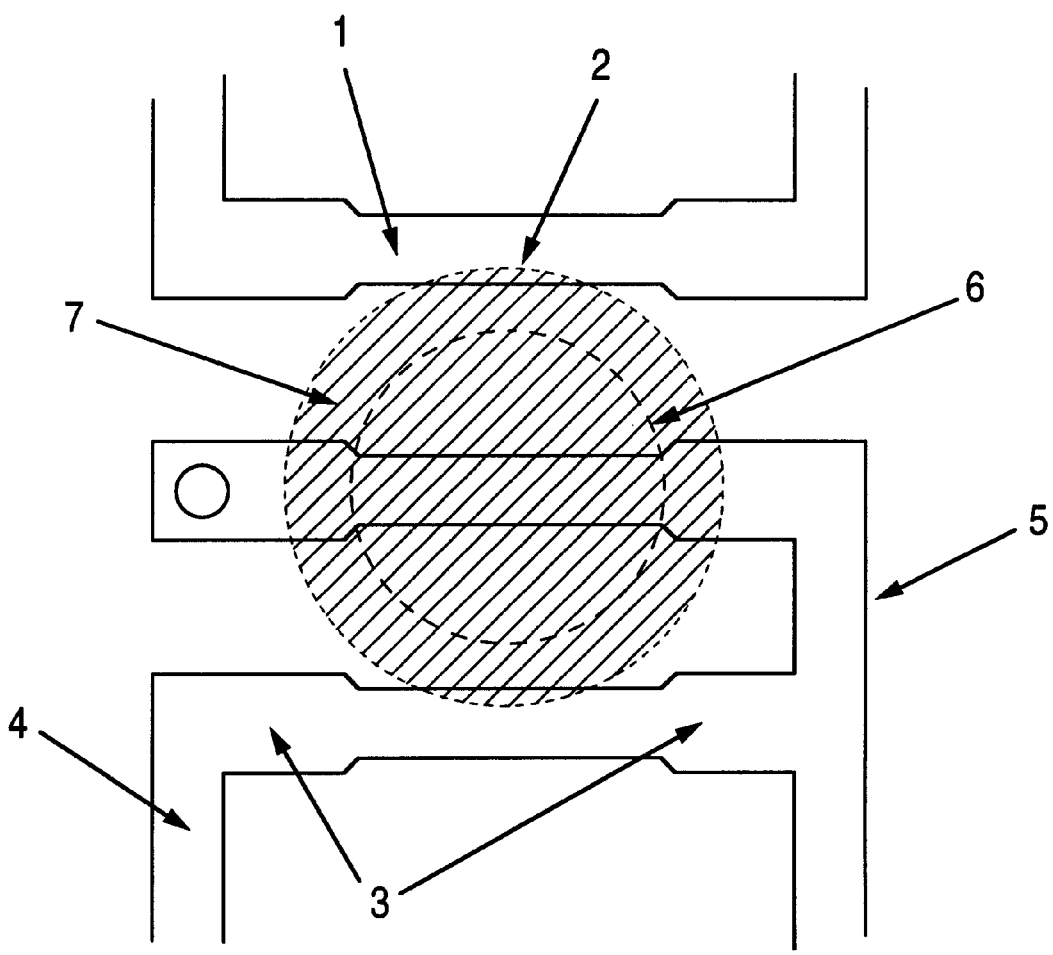
FIG. 1 illustrates a top plan view of a portion of an electronic device having conventional fuses.
Figure 2A:
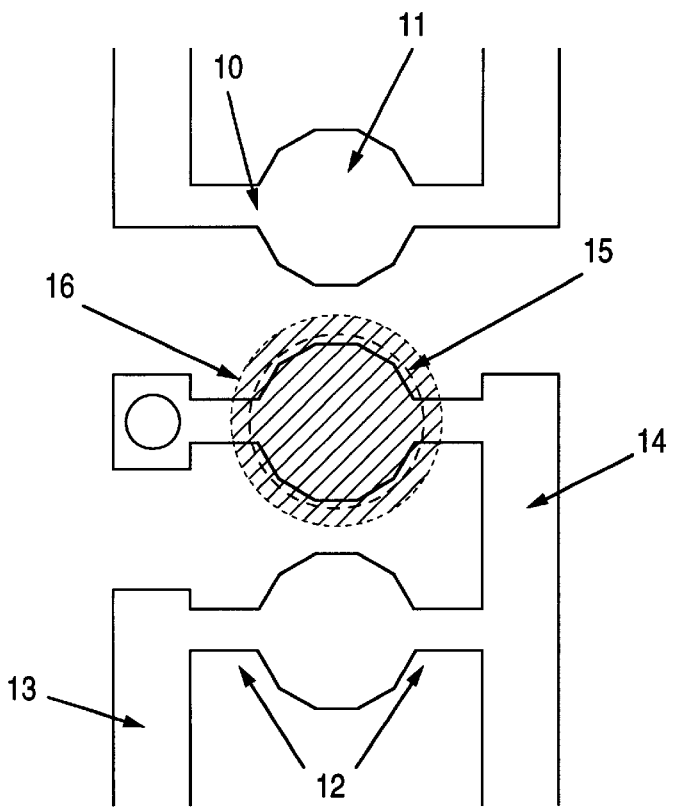
FIG. 2A illustrates a top plan view of a portion of an electronic device with radiant-energy configurable fuses in accordance with one embodiment of the present invention.

FIG. 2A illustrates a portion of an electronic device with radiant-energy configurable fuses 10 in accordance with one embodiment of the present invention. Depending on the desired characteristic properties, the configurable fuses 10 can be made from conductive materials including aluminum (Al), compounds of aluminum such as AlSi or AlSiCu, tungsten (W), titanium (Ti) or its commonly used compounds such as titanium-tungsten (TiW) or titanium-nitride (TiN), silicides commonly used in the industry, or any other conductive material capable of forming radiant-energy configurable fuses.

For applications where the fuse body is composed of metal, the fuses 10 may also have an anti-reflective layer (not shown) formed on the top surface to better enable the fuses to absorb the radiant-energy used for configuration. Titanium-nitride and titanium-tungsten are two such commonly used materials with anti-reflective properties which can be formed on the fuses 10 by conventional and well known methods.

Figure 2B:
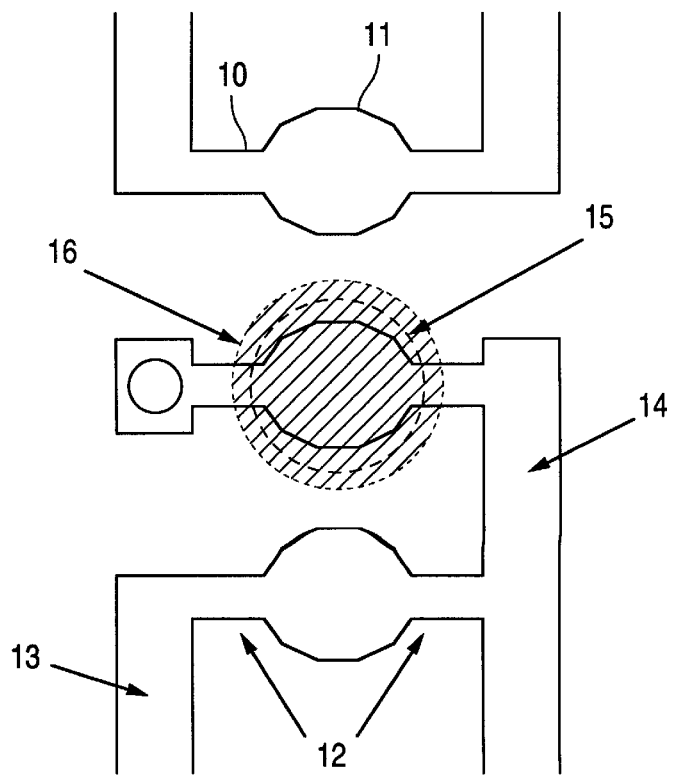
FIG. 2B illustrates a top plan view of a portion of an electronic device with radiant-energy configurable fuses in accordance with another embodiment of the present invention.

Each of fuses 10 has a fuse body 11 wider than at least one of connection terminals 12, which electrically connect adjacent conductive lines 13 and 14 and underlying circuit elements. A radiant energy beam 16 directs a beam with a spot size 15 larger than the fuse body 11 to blow the fuse and sever the electrical connection. The energy distribution of the radiant energy beam 16 is known to approximate a radial Gaussian distribution. To increase the ratio of captured radiant energy to fuse area above that of conventional fuse designs, the shape of fuse body 11 is circular and wider than the fuse terminals 12, which allows fuse body 11 to capture a maximum amount of the energy applied by the radiant energy beam 16. Accordingly, the shape of fuse body 11 should be generally circular or elliptical because a circle maximizes the surface area-to-perimeter ratio. However, in practical applications, such a fuse is implemented with a polygonal-shaped fuse body, as shown in FIG. 2A. The polygonal shape can be approximately circular, as shown in FIG. 2A, or approximately ovate, as shown in FIG. 2B, for example.

Since the captured energy increases, the amount of applied energy which is necessary to blow the fuse can be reduced, thus reducing the effective spot size 15. The connection terminals 12 are narrowed to the minimum allowed linewidth. This presents a smaller outlet for thermal conduction, thereby reducing the amount of thermal energy transferred away from the fuse body 11. This reduction has two desirable consequences. First, more heat is retained by the fuse body 11, further decreasing the amount of applied energy required to blow the fuse by the radiant energy beam 16 and reducing the effective spot size 15. Second, the length of the fuse terminals 12 can be shortened since the requirement to isolate heat from lines 13 and 14 has been reduced, and because the narrower line permits less heat to be transferred. These consequences further increase the packing density for the fuses 10 and decrease the overall size of the electronic device.

The circular shape of the fuse body has additional benefits. By maximizing the ratio of the surface area to the perimeter of the fuse body 11, the energy and pressure required to blow a fuse are minimized. As will be apparent to one skilled in the art, the shape of the fuse body 11 does not have to be perfectly circular, but could be ovate or polygonal to improve this ratio while optimizing the shape for a particular combination of fuse materials and insulator thickness over the fuse.

Figure 3A:
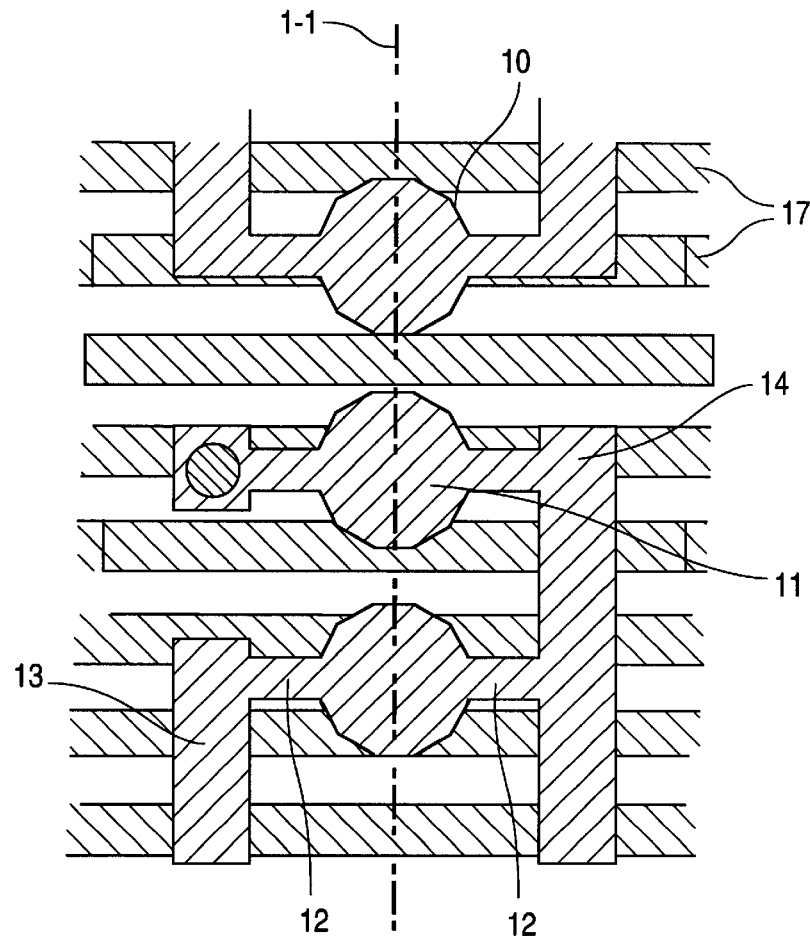
FIG. 3A illustrates a top plan view of a portion of an electronic device with the radiant-energy configurable fuses of FIG. 2 overlying circuit elements.
Figure 3B:
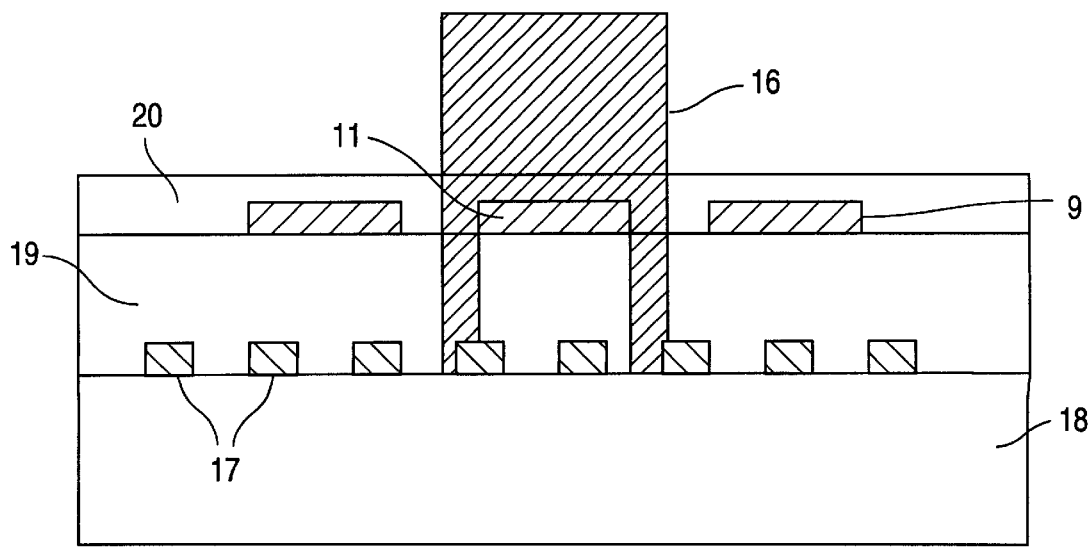
FIG. 3B illustrates a front cross-sectional view along sectional lines 1—1 of the embodiment of FIG. 3A.

FIG. 3A is a top view of the fuse structure of FIG. 2A overlying conductive interconnect lines 17. FIG. 3B is a side view along sectional line 1—1 of FIG. 3A, and illustrates an embodiment of the present invention wherein the energy required to blow the fuse is low enough that circuit elements can be placed underneath the fuses. The electronic device includes interconnect lines 17 formed above a semiconductor substrate 18 of either an N-type or a P-type conductivity. Because the present invention relates to the effective configuration and protection of circuit elements, the interconnect lines 17 have been provided for simplicity only. It should be recognized by persons who are skilled in the art that the interconnect lines 17 could represent various types of circuit elements. For example, circuit elements or active circuitry such as transistors, diodes, resistors, capacitors, or even a P/N-well in an N/P-type semiconductor substrate could be used instead of the interconnect lines 17.

Between the interconnect lines 17 and a fuse layer 9 containing fuses 10, an insulating layer 19 is formed using conventional and well known methods. The insulating layer 19 can include one or more layers made from one or more different dielectric materials such as silicon oxide and borophosphosilicate glass (BPSG). As in other embodiments, the fuse layer 9 may be a single or multiple layer structure formed with conventional and well known methods of deposition, and may also include an anti-reflective layer (not shown) to better enable the fuse body 11 to absorb the radiant energy used for configuration. The fuses 10 formed on insulating layer 19 are encapsulated with a second insulating layer 20, such as silicon oxide or silicon nitride. Radiant energy beam 16 has a non-uniform intensity, with the intensity decreasing along a radius from the center of the beam. The majority of the energy delivered is absorbed or reflected by fuse body 11, thus protecting the underlying interconnect lines 17 from damage. Because the design of fuse body 11 is optimized to capture the majority of the energy delivered by the radiant energy beam 16 and minimize the loss of this energy through thermal conduction, a relatively low level of radiant energy can be used to configure the fuse. This in turn minimizes the amount of energy which impacts the interconnect lines 17, further reducing the risk of damage.

Therefore, the fuse structure in accordance with the present invention provides several desirable features, including an increased laser fuse yield at a given laser energy, a larger process window for laser energy without substrate damage and with sufficient reliability of the fuse disconnection, a reduced area required for a fuse, thus increasing packing density and reducing overall circuit size, and an ability to place active circuit elements below the fuses, thus making more efficient use of the area around and under the fuses and further reducing the overall circuit size.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

What is claimed is:

1. A fuse structure for customizing or repairing an electrical device, the structure comprising:
    a radiant-energy beam configurable fuse body located between two conductive elements;
    a first terminal connecting said fuse body to one of said conductive elements; and
    a second terminal connecting said fuse body to the other of said conductive elements, wherein said fuse body is wider than at least one of said first and second terminals.

2. The structure of claim 1, wherein said radiant-energy beam configurable fuse body is wider than said first and second terminals.

3. The structure of claim 2, wherein said radiant-energy beam configurable fuse body is polygonal, having five or more sides.

4. The structure of claim 2, wherein said radiant-energy beam configurable fuse body is circular.

5. The structure of claim 2, wherein said radiant-energy beam configurable fuse body is ovate.

6. The structure of claim 2, wherein said first and second terminals are approximately co-planar with said radiant-energy beam configurable fuse body.

7. The structure of claim 2, wherein said radiant-energy beam configurable fuse body is at least 50% wider than at least one of said first and second terminals.

8. The structure of claim 1, wherein said radiant-energy configurable fuse body is polygonal and approximately circular.

9. The structure of claim 1, wherein said radiant-energy configurable fuse body is polygonal and approximately ovate.

10. The structure of claim 1, wherein said radiant-energy configurable fuse body is electrically disconnected from said two conductive elements by exposure to an energy beam.

11. A radiant-energy configurable array comprising:
    a fuse layer comprising:
        first and second conductive elements;
        a radiant-energy beam configurable fuse body located between said first and second conductive elements;
        a first terminal connecting said fuse body to said first conductive element; and
        a second terminal connecting said fuse body to said second conductive element, wherein said fuse body is wider than said first terminal;
    an electrically conductive circuit element layer underlying said fuse layer; and
    an insulating layer located between said fuse layer and said electrically conductive circuit element layer.

12. The array of claim 11, wherein said radiant-energy beam configurable fuse body is wider than said first and second terminals.

13. The array of claim 11, wherein said insulating layer is located below said fuse layer.

14. The array of claim 11, wherein said circuit elements are comprised of circuit elements positioned below said radiant-energy beam configurable fuse body.

15. The array of claim 11, wherein said radiant-energy beam configurable fuse body is approximately co-planar with said first and second terminals.

16. A method of forming a radiant-energy beam configurable array, said method comprising:
    forming a fuse layer on an insulating layer, comprising:
        forming at least one radiant-energy configurable fuse body;

forming circuit elements; and forming terminals connecting said at least one fuse body to said circuit elements, wherein said at least one fuse body is wider than said terminals; and exposing a selected one of said at least one radiant-energy configurable fuse body with an energy beam for electrically disconnecting said selected radiant-energy configurable fuse body from said conductive elements.

17. A radiant-energy beam configurable array, comprising:

a fuse layer comprising:
first and second conductive elements;
a radiant-energy configurable fuse body located between said first and second conductive elements, wherein said radiant-energy configurable fuse body is circular;
a first terminal connecting said fuse body to said first conductive element; and
a second terminal connecting said fuse body to said second conductive element, wherein said fuse body is wider than said first terminal;
an electrically conductive circuit element layer underlying said fuse layer; and
an insulating layer located between said fuse layer and said electrically conductive circuit element layer.

18. A radiant-energy beam configurable array, comprising:

a fuse layer comprising:
first and second conductive elements;
a radiant-energy configurable fuse body located between said first and second conductive elements, wherein said radiant-energy configurable fuse body is polygonal, having five or more sides;
a first terminal connecting said fuse body to said first conductive element; and
a second terminal connecting said fuse body to said second conductive element, wherein said fuse body is wider than said first terminal;
an electrically conductive circuit element layer underlying said fuse layer; and
an insulating layer located between said fuse layer and said electrically conductive circuit element layer.

19. A radiant-energy beam configurable array comprising:

a fuse layer comprising:
first and second conductive elements;
a radiant-energy configurable fuse body located between said first and second conductive elements, wherein said radiant-energy configurable fuse body is ovate;
a first terminal connecting said fuse body to said first conductive element; and
a second terminal connecting said fuse body to said second conductive element, wherein said fuse body is wider than said first terminal;
an electrically conductive circuit element layer underlying said fuse layer; and
an insulating layer located between said fuse layer and said electrically conductive circuit element layer.

20. A radiant-energy beam configurable array, comprising:

a fuse layer comprising:
first and second conductive elements;
a radiant-energy configurable fuse body located between said first and second conductive elements;
a first terminal connecting said fuse body to said first conductive element; and
a second terminal connecting said fuse body to said second conductive element, wherein said fuse body is wider than said first terminal and wherein said radiant-energy configurable fuse body is at least 50% wider than at least one of said first and second terminals;
an electrically conductive circuit element layer underlying said fuse layer; and
an insulating layer located between said fuse layer and said electrically conductive circuit element layer.

21. A method of forming a radiant-energy configurable array, said method comprising:

forming a fuse layer on an insulating layer, comprising:
forming at least one radiant-energy beam configurable fuse body;
forming circuit elements; and
forming terminals connecting said at least one fuse body to said circuit elements, wherein said at least one fuse body is wider than said terminals.

22. A method of forming a radiant-energy configurable array, said method comprising:

forming a first set of electrically conductive circuit elements over a substrate;
depositing an insulating layer on said first set of circuit elements; and
forming a fuse layer on said insulating layer, comprising:
forming at least one radiant-energy beam configurable fuse body over said first set of circuit elements;
forming a second set of circuit elements; and
forming terminals connecting said at least one fuse body to said second set of circuit elements, wherein said at least one fuse body is wider than said terminals.

* * * * *